United States Patent
Ahdab et al.

[11] Patent Number: 5,821,821
[45] Date of Patent: Oct. 13, 1998

[54] ICO BASED LINEAR GAIN VCO WITH NON-LINEAR V/I CONVERTER

[75] Inventors: Ahmad Ahdab, Mississauga; Hugh Chow, Thornhill; Raymond Chau, Toronto, all of Canada

[73] Assignee: ATI Technologies Incorporated, Unionville, Canada

[21] Appl. No.: 804,825

[22] Filed: Feb. 24, 1997

[51] Int. Cl.$^6$ .................................................. H03B 27/00
[52] U.S. Cl. .......................... 331/57; 331/34; 331/177 R; 331/185
[58] Field of Search .................. 331/57, 108 R, 331/185, 34, 177 R

[56] References Cited

U.S. PATENT DOCUMENTS

| | | | |
|---|---|---|---|
| 4,891,609 | 1/1990 | Eilley | 331/57 |
| 5,359,298 | 10/1994 | Abe | 331/57 X |
| 5,568,103 | 10/1996 | Nakashima et al. | 331/185 |

*Primary Examiner*—Huan Hoang
*Attorney, Agent, or Firm*—Pascal & Associates

[57] ABSTRACT

A voltage controlled oscillator comprising: a ring of inverters comprised of an odd number of serially connected CMOS inverter stages, the inverter stages being connected between first and second oppositely poled power leads, a MOSFET having a source-drain circuit connected between one of the power leads and a first power rail, the other power lead being connected to a second power rail, apparatus for operating the MOSFET in saturation, and apparatus for applying a control voltage to the gate of the MOSFET, referenced to the second power lead, whereby the MOSFET operates as a nonlinear current conduction device having a characteristic such as to linearize the voltage-frequency characteristic of the combined MOSFET—ring oscillator combination.

8 Claims, 2 Drawing Sheets

ICO BASED LINEAR GAIN VCO WITH NON-LINEAR V/I CONVERTER

FIELD OF THE INVENTION

This invention relates to the field of current and voltage controlled oscillators, and in particular to a linear form of such oscillators.

BACKGROUND TO THE INVENTION

Voltage controlled oscillators are used extensively in phase locked loops. Such oscillators typically are comprised of a ring of inverters, control of the frequency of oscillation thereof being effected by controlling the current carried by the inverters.

FIG. 1 illustrates an oscillator comprised of a series of inverters 1, connected in a ring, the output of one inverter being connected to the input of the following inverter. An output signal can be obtained at the output of one of the inverters, shown as terminal OUT. Corresponding power terminals of all of the inverters are connected together across power leads nddi and nssi, across which the voltage Vddi is measured.

Control of the current I passing between the nddi and nssi leads through the inverters causes variation of the frequency of oscillation, as will be shown below.

Each of the inverters is preferably formed of a complementary symmetry metal oxide silicon field effect transistor (CMOS FET) pair, as shown in FIG. 2. The inverter is formed of the source-drain circuit of a p-channel FET 3 connected in series with the source-drain circuit of an n-channel FET 5 between the positive supply nddi and the negative supply nssi. The gates of the FETs 3 and 5 are connected together to an input IN and the junction of the drain of FET 5 and the source of FET 3 is connected to an output OUT.

If the CMOS inverter is viewed as having its frequency primarily dependent on the current, then its state variable is current, and operation and control of the system can be described by specifying the relationship between the oscillation frequency and the current. The choice of either current or voltage as the state variable leads to two equivalent but different descriptions of the same circuit. One of these will be found to be more appropriate than the other for the case.

For the oscillator shown in FIG. 1, a voltage to current converter must be added in cascade and prior to the oscillating element to form a voltage controlled oscillator. This topology is often referred to as a current controlled oscillator based VCO.

The average current consumed by a single inverter is:

$$i = dQ/dt$$

where
dQ=change in charge and
dT=time interval
During a clock period T, N inverters change state so that $$dQ = N*C*\text{delta}(V) = N*C*Vddi$$

where
delta(V)=change in node voltage
Vddi=average DC voltage across oscillator element
The delay between input and output of a CMOS inverter is given by approximately $$Td = 0.9*C/Vddi*(Bp+Bn)/(Bn*Bp) \quad \text{(equation 1)}$$
$$= \text{alpha}*C/Vddi$$

where
Bn=transconductance of n-channel MOS device
Bp=transconductance of p-channel MOS device
C=input capacitance of the inverters
alpha=a constant and
Vddi=voltage across CMOS inverters.
The ring oscillator period and frequency are given by $$\text{period} = 2*N*Td = 2*N*(\text{alpha}*C/Vddi)$$

$$fosc = 1/\text{period} = Vddi/(2*N*\text{alpha}*C) \quad \text{(equation 2)}$$

where N=number of inverters
As equation 1 shows, the period of interest dT is given by Td, so that $$dT = 1/fosc = 2*N*\text{alpha}*C/Vddi$$

Thus the current i is given by $$i = (N*C*Vddi)/(2*N*\text{alpha}*C/Vddi) = \text{alpha}/2*(Vddi)^2$$

Because frequency is proportional to voltage $$i = \text{gamma}*\text{frequency}^2 \quad \text{(equation 3)}$$

where gamma=a constant.
It is important to note from equation 3 that the input current is dependent on the square of the output frequency, or conversely, the output frequency varies as the square-root of the current. A structure such as shown in FIG. 1 is thus inherently nonlinear.

SUMMARY OF THE INVENTION

It is desirable to have the oscillation frequency of the oscillator linearly dependent on a control voltage, so that the damping factor and bandwidth are independent of operating frequency for a given closed loop configuration. The present invention provides such a structure, by adding a complimentary nonlinearity to the voltage-current characteristic of the oscillator, to linearize the composite voltage to frequency characteristic. The complimentary nonlinear structure has an output current that is dependent on the square of the input voltage, which compensates closely or exactly the nonlinearity of the oscillator.

In accordance with an embodiment of the present invention, a voltage controlled oscillator is comprised of (a) a ring of inverters comprised of an odd number of serially connected CMOS inverter stages, the inverter stages being connected between first and second oppositely poled power leads, (b) a MOSFET having a source-drain circuit connected between one of the power leads and a first power rail, the other power lead being connected to a second power rail, (c) apparatus for operating the MOSFET in saturation, and (d) apparatus for applying a control voltage to the gate of the MOSFET, referenced to the second power lead, whereby the MOSFET operates as a nonlinear current conduction device having a characteristic such as to linearize the voltage-frequency characteristic of the combined MOSFET—ring oscillator combination.

In accordance with another embodiment, a voltage controlled oscillator is comprised of a ring of CMOS inverters having an odd number of stages, a power source to power the inverters, and apparatus for controlling current conducted by the inverters from the power source in response to a control voltage in a nonlinear manner, the nonlinearity characteristic of the controlling apparatus being such as to counter an effect of nonlinearity in current to frequency operation of the ring of inverters, whereby the resulting frequency of oscillation of the oscillator is rendered linearly related to the control voltage.

In accordance with another embodiment, the controlling apparatus is comprised of a voltage to current converter having a non-linear characteristic connected between the inverters and the power source so as to control current conducted by the inverters in response to a control voltage.

In accordance with another embodiment, the voltage to current converter is a MOSFET operating in saturation.

BRIEF INTRODUCTION TO THE DRAWINGS

A better understanding of the invention will be obtained by considering the detailed description below, with reference to the following drawings, in which.

DETAILED DESCRIPTION OF THE INVENTION

Figure 1:
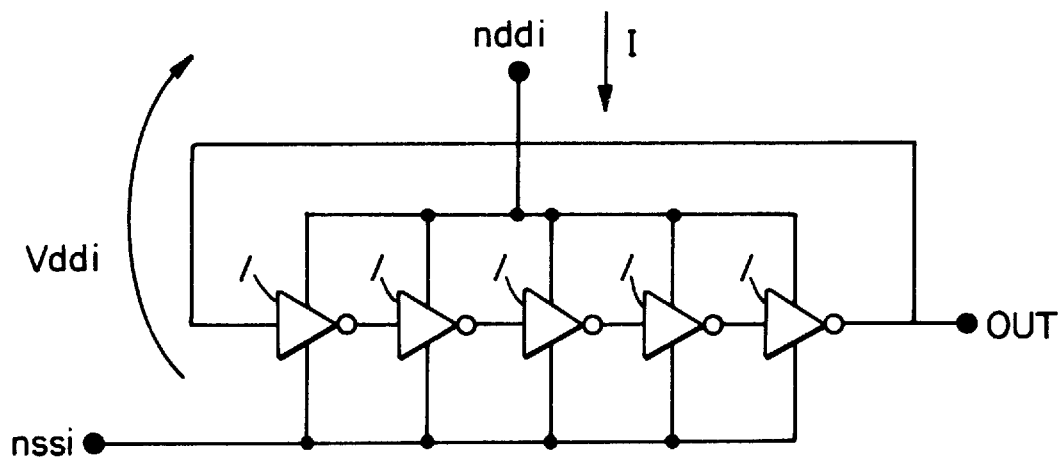
FIG. 1 is a block diagram of a ring oscillator formed of inverters.
Figure 2:
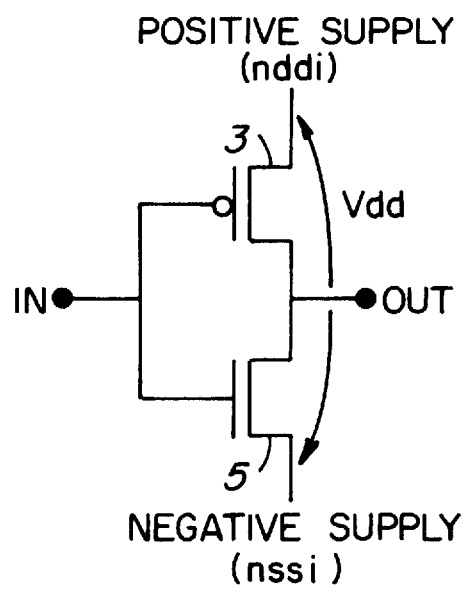
FIG. 2 is a schematic diagram of a CMOS inverter.
Figure 3:
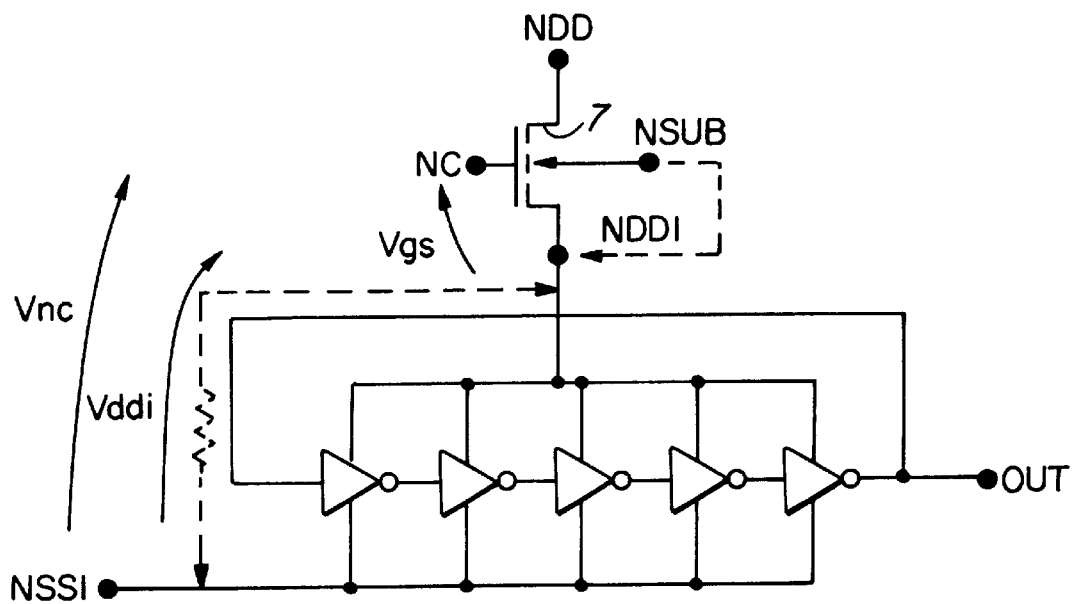
FIG. 3 is a schematic diagram of one embodiment of the invention.

FIG. 3 illustrates an embodiment of the present invention. The oscillator illustrated in FIG. 1 is connected between a pair of power leads NDDI and NSSI, where NSSI is a common reference node.

In this embodiment the source-drain circuit of a MOSFET 7 is connected between the power lead NDDI and a power rail node NDD. Power rails are connected to NDD and NSSI. The voltage Vddi is defined as the voltage between NDDI and NSSI, and a control voltage Vnc is applied between the gate of MOSFET 7 and NSSI. The substrate of MOSFET 7 is connected to the source of the MOSFET in the configuration illustrated.

Figure 4:
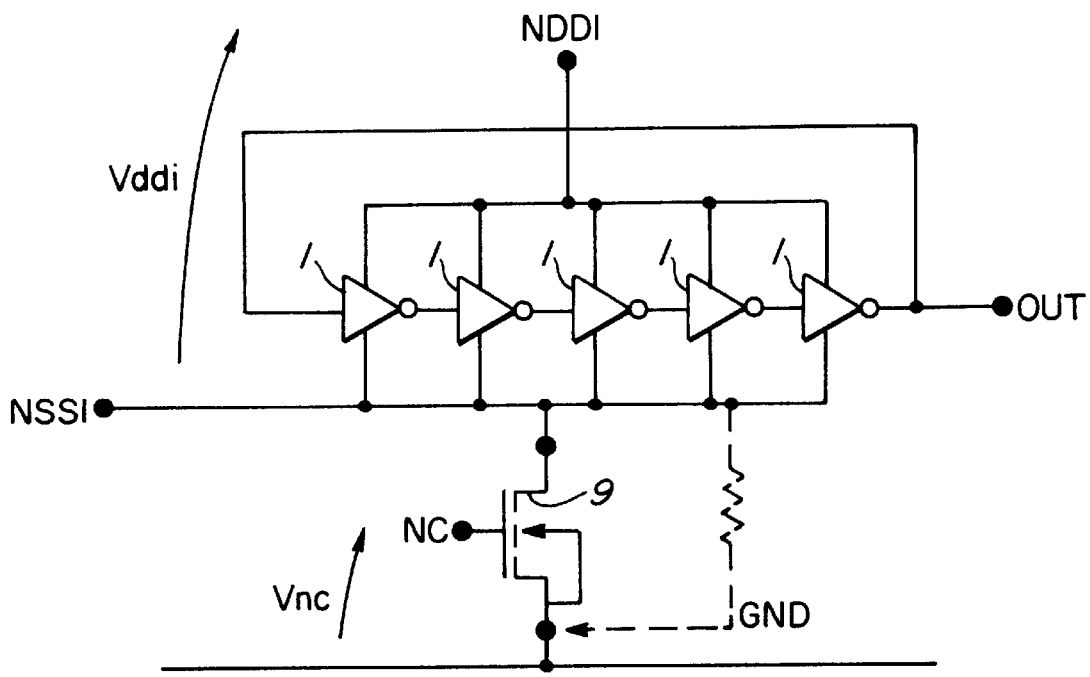
FIG. 4 is a schematic diagram of another embodiment of the invention.

FIG. 4 illustrates another embodiment of the present invention. The oscillator illustrated in FIG. 1 is connected between a pair of power leads NDDI and NSSI, where NSSI is a common reference node.

In this embodiment the source-drain circuit of a MOSFET 9 is connected between the power lead NSSI and ground GND. Power rails are connected to NDDI and ground. The voltage Vddi is defined as the voltage between NDDI and NSSI, and a control voltage Vnc is applied between the gate of MOSFET 9 and GND. The substrate of MOSFET 9 is connected to its source, i.e. to ground in the configuration illustrated.

It was noted from equation 3 above, that the output frequency of the oscillator varies as the square root of the current. In order to realize a linear composite voltage-frequency characteristic, the voltage to current converter must have an output current that is dependent on the square of the input voltage such as to complement the ICO current to frequency characteristic. By controlling the voltage Vddi directly across the CMOS inverter elements, a linear frequency characteristic for the VCO can be achieved. If the power demands of the CMOS oscillator elements are not of concern, the supply voltage can be driven directly by a control voltage to realize a VCO. The appropriate state variable in this case is voltage.

To obtain high input impedance, the node Vddi is buffered by either a unity gain follower or a simple source follower provided by MOSFET 7, as shown in FIG. 3. The voltage Vddi is actually a portion of the control voltage Vnc. A linear frequency voltage to current characteristic will result.

Vddi and Vnc are linearly related. This requires that either the ratio between the two voltage values or the difference between them is equal to a constant.

Nonlinearity using the source follower configuration can result if certain types of variations in the gate to source voltage Vgs occur:

1) Changes to Vgs that result from threshold voltage modulation with input level. In the case of a p-well process only to produce the n-channel MOSFETs, the problem can be avoided by connecting the substrate node NSUB to the source node NDDI, as shown in FIG. 3.

2) Changes to Vgs that result from varying output current demands of the ICO with frequency. It will be shown below that only a gain error (i.e. no nonlinearity, but a drop in gain) occurs as a result of a quadratic relationship between current and gate voltage.

3) The source follower based ICO has three FET devices that have gate to source junctions in series. This means that the minimum supply voltage must be the sum of at least three threshold voltages.

By using the nonlinear voltage to current source shown in FIG. 4 instead of the voltage follower shown in FIG. 3, a single FET topology is realized, that solves the shortcomings of 1) and 3) noted above. In the structure of FIG. 4, current I is treated as the state variable.

The relationship between the current I and frequency can be determined as follows, repeated from its earlier treatment above:

The average current consumed by a single inverter is:

$$i = dQ/dt \qquad \text{(equation 4)}$$

where
  dQ=change in charge and
  dT=time interval
During a clock period T, N inverters change state so that $$\begin{aligned} dQ &= N*C*\text{delta}(V) \\ &= N*C*Vddi \end{aligned}$$

where
  delta(V)=change in node voltage
  Vddi=average DC voltage across oscillator element
As noted earlier, and as equation 1 shows, the period of interest dT is given by Td, so that $$dT = 1/fosc = 2*N*\text{alpha}*C/Vddi$$

Thus the current i is given by $$i = (N*C*Vddi)/(2*N*\text{alpha}*C/Vddi = \text{alpha}/2*(Vddi)^2$$

Because frequency is proportional to voltage $$i = \text{gamma}*\text{frequency}^2 \qquad \text{(equation 5)}$$

where gamma=a constant.

The MOS devices illustrated in FIGS. 3 and 4, operating in saturation as a current source provide the required square law relationship between their gate to source voltages Vgs and its drain current, wherein $$i = \text{Beta} * (Vgs - Vt)^2$$

where
Beta=the current gain the MOSFET
Vgs=the gate to source voltage
Vt=the threshold voltage The ICO based control voltage Vnc is referenced to the common reference node NSSI in FIG. 4 and is equal only to the MOSFET gate to source voltage. In the case of the non-ICO based structure of FIG. 3, the control voltage is comprised of two component voltages: Vgs and Vddi.

Connecting the MOSFET 9 to the ICO as shown in FIG. 4 results in the frequency found to be linearly dependent on the applied gate voltage:

$$\text{Frequency} = sqrt(\text{Beta/gamma}) * (Vgs - Vt)$$

where Vt is the threshold voltage of the MOSFET 9.

An ICO based VCO has inherently low voltage and noise suppression capabilities. The structure shown in FIG. 4 has been found not to suffer from threshold voltage modulation from the substrate and to be able to operate down to lower voltages than the structure shown in FIG. 3.

The structures are illustrated in FIGS. 3 and 4 using NMOS MOSFETs. However, PMOS devices could be used as the current sources, with the polarities of the voltage supply reversed.

The circuit can be modified to have slightly different index values for the power term between 1 and 2 by adding a resistor between the sources of MOSFETS 7 and 9 and NSSI, to more accurately match the CMOS oscillator and the voltage to current converter.

A person understanding this invention may now conceive of alternative structures and embodiments or variations of the above. All those which fall within the scope of the claims appended hereto are considered to be part of the present invention.

We claim:

1. A voltage controlled oscillator comprising:
   (a) a ring of inverters comprised of an odd number of serially connected CMOS inverter stages, the inverter stages being connected in parallel between first and second oppositely poled power leads,
   (b) a MOSFET having a source-drain circuit connected between one of the power leads and a first power rail, the other power lead being connected to a second power rail,
   (c) means for operating the MOSFET in saturation, and
   (d) means for applying a control voltage to the gate of the MOSFET, referenced to the second power lead,
   whereby the MOSFET operates as a nonlinear current conduction device having a characteristic such as to linearize the voltage-frequency characteristic of the combined MOSFET—ring oscillator combination.

2. An oscillator as defined in claim 1 in which the first power rail is ground, and the MOSFET is of NMOS conductivity type, and in which the source-drain circuit of the MOSFET is connected between the second power lead and ground, the control voltage being applied between the gate of the MOSFET and ground.

3. An oscillator as defined in claim 2 in which the substrate of the MOSFET is connected to the source of the MOSFET.

4. An oscillator as defined in claim 1 in which the MOSFET is of NMOS conductivity type, and in which the source-drain circuit of the MOSFET is connected between the first power lead and the first power rail, the control voltage being applied between the gate of the MOSFET and the second power lead.

5. An oscillator as defined in claim 4 in which the substrate of the MOSFET is connected to the first power lead.

6. An oscillator as defined in claim 4 further including a resistor connected between the source of the MOSFET and the second power lead.

7. A voltage controlled oscillator comprising a ring of CMOS inverters having an odd number of stages, a power source connected to power the ring of inverters, and a voltage to current converter having a nonlinear characteristic connected between the ring of inverters and the power source so as to control current conducted by the inverters in response to a control voltage in a nonlinear manner, the nonlinearity characteristic of the converter being such as to counter an effect of nonlinearity in current to frequency operation of the ring of inverters, whereby the resulting frequency of oscillation of the oscillator is rendered linearly related to the control voltage.

8. A voltage controlled oscillator comprising a ring of CMOS inverters having an odd number of stages, a power source to power the inverters, and means for controlling current conducted by the inverters from the power source in response to a control voltage in a nonlinear manner, the nonlinearity characteristic of the controlling means being such as to counter an effect of nonlinearity in current to frequency operation of the ring of inverters, whereby the resulting frequency of oscillation of the oscillator is rendered linearly related to the control voltage.

* * * * *